United States Patent [19]

Lee

[11] Patent Number: 4,704,625
[45] Date of Patent: Nov. 3, 1987

[54] CAPACITOR WITH REDUCED VOLTAGE VARIABILITY

[75] Inventor: Robert D. Lee, Pilot Point, Tex.

[73] Assignee: Motorola, Inc., Schaumburg, Ill.

[21] Appl. No.: 405,460

[22] Filed: Aug. 5, 1982

[51] Int. Cl.$^4$ .................. H01L 29/93; H01L 29/94; H01L 29/52

[52] U.S. Cl. .................. 357/51; 357/23.6; 357/14

[58] Field of Search .................. 357/23 C, 51, 14, 65

[56] References Cited

U.S. PATENT DOCUMENTS

| | | | |
|---|---|---|---|
| 3,535,600 | 10/1970 | Engeler | 357/23 C |
| 3,562,608 | 2/1971 | Gallagher et al. | 357/23 C |
| 4,255,677 | 3/1981 | Boonstra et al. | 357/23 C |

*Primary Examiner*—Andrew J. James
*Assistant Examiner*—S. V. Clark
*Attorney, Agent, or Firm*—John A. Fisher; Jeffrey Van Myers; Robert L. King

[57] ABSTRACT

An MOS capacitive structure comprising a substrate of a first conductivity type, a first region of the first conductivity type but having a different impurity concentration for contacting the substrate, a second region of opposite conductivity type for contacting the substrate, and a dielectric over a region of the substrate adjacent the first and second regions and having a conductive layer thereon forming one plate of the capacitor while the substrate opposite the conductive layer forms the other plate. The first and second regions are contacted and coupled together in order to provide good electrical contact to the substrate region opposite the conductive layer regardless of whether the substrate under the conductive layer is depleted or inverted.

7 Claims, 5 Drawing Figures

CAPACITOR WITH REDUCED VOLTAGE VARIABILITY

FIELD OF THE INVENTION

This application relates to capacitive structures in complementary MOS integrated circuits, and more particularly to a structure and method for producing CMOS capacitors which are relatively voltage independent.

PRIOR ART

Capacitors commonly used in, for example, silicon gate CMOS integrated circuits where it is necessary to contact both plates of the capacitor, usually comprise a thin oxide insulator over a region of a substrate of lightly doped silicon, for example, a P− substrate, with a layer of doped polysilicon over the oxide to form one plate of the capacitor. The other plate is the substrate region itself opposite the polysilicon, which is contacted usually through a region of silicon which is more heavily doped, (P+), by diffusion, implantation or other techniques. A capacitor formed in this manner, however, is sensitive to the polysilicon to substrate voltage in that the capacitance decreases drastically as a threshold voltage of the capacitive contact structure is approached, and becomes very small as the P− substrate opposite the polysilicon inverts, as will be explained in greater detail below.

SUMMARY OF THE INVENTION

It is a principal object of the present invention to provide a CMOS capacitive structure with a relatively constant capacitance over polysilicon to substrate voltage variations.

In a preferred embodiment, the above object is accomplished by providing an MOS capacitive structure comprising a substrate of a first conductivity type, a first region of the first conductivity type but having a different impurity concentration for contacting the substrate, a second region of opposite conductivity type for contacting the substrate, and a dielectric over a region of the substrate adjacent the first and second regions and having a conductive layer thereon forming one plate of the capacitor while the substrate opposite the conductive layer forms the other plate. The first and second regions are contacted and coupled together in order to provide good electrical contact to the substrate region opposite the conductive layer regardless of whether the substrate under the conductive layer is depleted or inverted.

This and other objects and advantages of the present invention will become manifest by an examination of the following description and the accompanying drawings.

DESCRIPTION OF A PREFERRED EMBODIMENT

Figure 1:
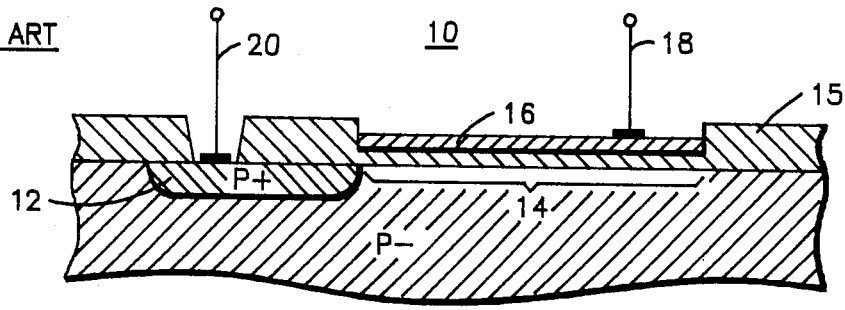
FIG. 1 shows a capacitor as described in the prior art.

FIG. 1 shows a cross section of a capacitive element formed in a silicon substrate as constructed in integrated circuits of the prior art.

A substrate 10 is fabricated of liqhtly doped (P−) silicon. While silicon is described throughout this specification, it should be understood that other semiconductive materials may be used. Also, in any case where a material of one conductivity is noted, those skilled in the art will appreciate that another conductivity type may be substituted (i.e., P doped silicon may be substituted for N doped silicon) so long as the operative conductive relationships with other regions are maintained.

In the surface of substrate 10 is formed a region 12 of the same conductivity type as the substrate, but with a higher impurity concentration (indicated as P+) than the substrate. The region 12 may be formed by diffusion, ion implantation, or by other means.

A layer of silicon dioxide 15, or other insulating material, is formed or placed over a portion 14 of the substrate 10, over which is formed a conductive layer 16 which may be doped polysilicon.

Electrical contact is made to the layer 16 by electrode 18 in a conventional manner. Similarly an electrical contact is made to the P+ region 12 by a second electrode 20.

A capacitive element has thus been defined in which one "plate" of the capacitor is formed by polysilicon layer 16 and the other "plate" is formed by the P− region 14 of the substrate opposite polysilicon layer 16. Electrical contact to the substrate region 14 is via P+ region 12 and the electrode 20 contacted thereto.

Figure 2:
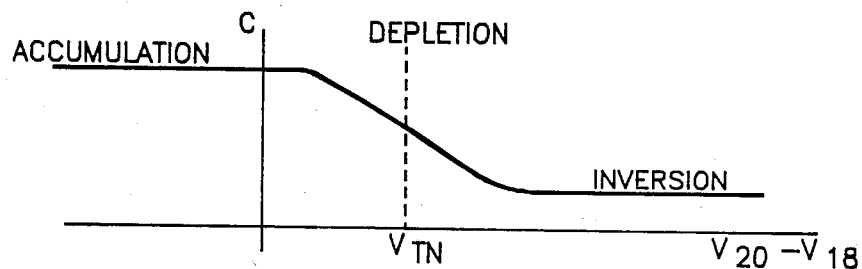
FIG. 2 shows a representative capacitance vs. conductive layer to substrate voltage curve for the device of FIG. 1.

A capacitor thus formed however is voltage sensitive. FIG. 2 shows a representation of the relationship between the voltage potential difference across the two plates of the capacitor, $V_{20}-V_{18}$ and the capacitance, C.

With a negative voltage (i.e. $V_{20}$ is not as positive as $V_{18}$) the capacitance of the capacitor remains high. As $V_{20}$ becomes more positive than $V_{18}$, the region 14 of substrate 10 under the polysilicon layer 16 becomes depleted of positive carriers and the capacitance between the substrate region 14 and polysilicon layer 16 decreases because the contact between P+ region 12 and the substrate which is now, for example P− −, is impaired. Finally as $V_{20}$ becomes much greater than $V_{18}$, the substrate region 14 completely inverts to N-type material, with an excess of negative (electron) carriers and the capacitance between the polysilicon layer 16 and substrate region 14 is greatly reduced since contact between region 12 and region 14 has become a reverse biased diode.

Figure 3:
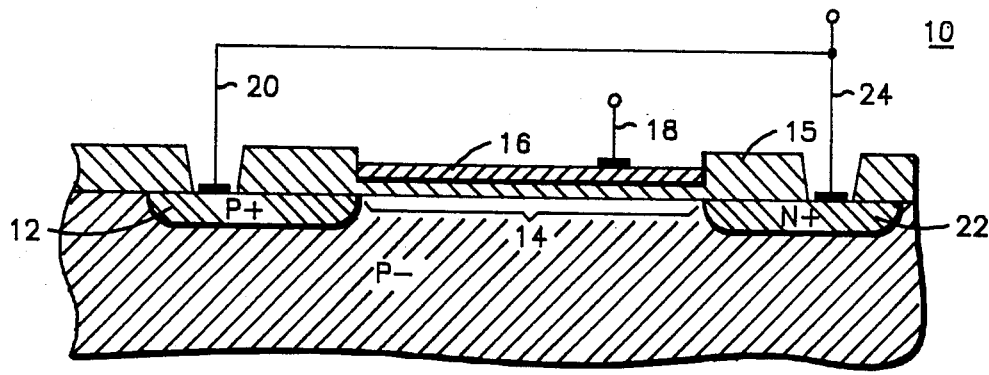
FIG. 3 shows a view of a capacitor in accordance with the instant invention.

FIG. 3 shows a capacitor formed in accordance with the instant invention. Similarly to FIG. 1, a P− substrate 10 is provided into which is diffused or implanted a region 12 of higher impurity concentration (P+). Opposite a region 14 of the substrate 10, is formed a conductive layer of, for example, polysilicon 16 over a relatively thin layer of insulating material such as silicon dioxide 15.

As in the device of FIG. 1, one plate of a capacitor is formed by the polysilicon layer 16 which is contacted by way of an electrode 18. The other plate of the capacitor is formed by substrate region 14 which is contacted via region 12 by means of an electrode 20. In the improved capacitive element, however, a second region 22 is formed in the substrate 10 adjacent region 14 of the substrate. The region 22 is doped to an opposite conductivity type (N+) than the substrate, and is contacted in the conventional manner by electrode 24. Electrodes 20 and 24 may then be connected together to form, in combination, contact to the lower plate 14 of the capacitor.

Figure 4:
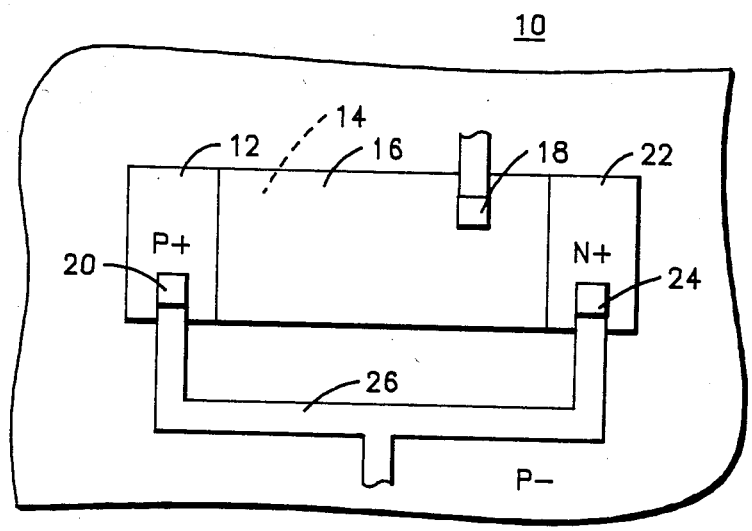
FIG. 4 shows a top view of the MOS integrated circuit layout of a device in accordance with the instant invention.

FIG. 4 shows a top view of a structure according to the invention. The P− substrate 10 is shown which, in the case of an integrated circuit may be either a substrate, an epitaxial layer, or a "well" or "tub" in which devices may be built. A polysilicon layer 16 is shown which forms the top plate of the capacitor as previously described. An electrode 18 contacts the polysilicon and is directed to its respective electrical connection by conductive metal or polysilicon. Underlying the polysilicon layer 16, is a thin oxide layer as previously described and a region of the substrate 14 which forms the bottom plate of the capacitor. The P+ region 12 is shown with its electrode contact 20 leading to a metal (or other conductive material) line 26 for connection to the remaining circuit components. Diffused (or implanted) region 22 of N+ material is shown also with its electrode connection 24 to the metal conductor 26. The actual locations of P+ region 12 and N+ region 22 are not critical with respect to each other, but each must be adjacent substrate region 14 so that each region 12 and 22 may be used to provide good electrical contact to region 14.

Figure 5:
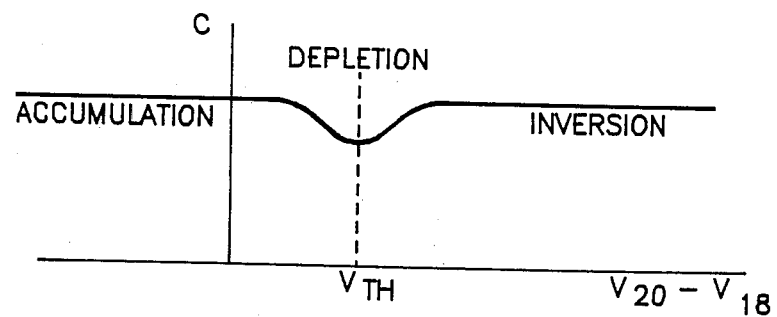
FIG. 5 shows a representative capacitance vs. conductive layer to substrate voltage curve for the device of FIGS. 3 and 4.

FIG. 5 shows a representation of capacitance versus potential difference between the plates of the capacitor. The left side of the curve shows the relatively high capacitance displayed by the capacitor when $V_{18}$ is higher than $V_{20}$ as also shown in FIG. 2. As the voltage of electrode 20 becomes relatively more positive than the voltage of electrode 18, and the device substrate beneath the polysilicon layer 16 begins to deplete, the capacitance tends to drop. But as the region 14 becomes more depleted, the effect of N+ region 22 acts to pull the capacitance back to its previously high level by forming a conductive path between the N+ region 22 and the highly depleted region 14. Subsequently, as $V_{20}$ becomes much more positive than $V_{18}$, region 14 is inverted to appear as an N-type material. The region 22 then provides an excellent contact to region 14 and the capacitance returns approximately to its high value. Thus the addition of doped region 22, doped to a conductivity type opposite to that of the substrate and region 12 maintains the capacitance of the capacitive element at a relatively constant rate instead of being variable with voltage.

As previously noted, while the invention has been described in terms of a lightly doped P-type substrate, a substrate of opposite conductivity type could utilize the principles of the instant invention. Of course, as is well known, the voltages would be opposite to that as described herein.

Though the invention has been described in terms of a preferred embodiment thereof, many modifications and variations will be available to those skilled in the art. This invention is intended to be limited only by the scope of the claims appended hereto.

I claim:

1. A semiconductor device comprising:
    a substrate of a first conductivity type and having a first surface,
    a first region in and adjacent to the surface, of the first conductivity type, and having an impurity concentration higher than that of the substrate,
    a second region in and adjacent to the surface of opposite conductivity type to the substrate, and spaced apart from the first region,
    means for contacting the first region and the second region and for coupling the first region and the second region together,
    a conductive layer opposite a region of the substrate abutting the first region and the second region and insulated from the substrate, and
    means for contacting the conductive layer thereby forming a capacitor in which one plate is contacted by the first and second regions and a second plate is formed by the conductive layer.
2. A semiconductor device as set forth in claim 1 wherein the substrate and the first region are of N-type material, and the second region is of P-type material.
3. A semiconductor device as set forth in claim 1 wherein the substrate and the first region are of P-type material, and the second region is of N-type material.
4. A semiconductor device comprising:
    a substrate of a first conductivity type and having a surface,
    a well of a second conductivity type formed in and adjacent to the surface,
    a first region in the well, of the second conductivity type, and having an impurity concentration higher than that of the well,
    a second region in the well, of the first conductivity type, and spaced from the first region,
    means for contacting the first region and the second region and for coupling the first region and the second region together,
    a conductive layer opposite a region of the well abutting the first region and the second region, and insulated from the well, and
    means for contacting the conductive layer,
    thereby forming a capacitor in which one plate is contacted by the first and second regions and a second plate is formed by the conductive layer.
5. A semiconductor device comprising:
    a substrate of a first conductivity type and having a surface,
    a well of the first conductivity type formed in and adjacent o the surface,
    a first region in the well, of the first conductivity type, and having an impurity concentration higher than that of the well,
    a second region in the well, of the second conductivity type, and spaced from the first region,
    means for contacting the first region and the second region and for coupling the first region and the second region together,
    a conductive layer opposite a region of the well abutting the first region and the second region, and insulated from the well, and
    means for contacting the conductive layer,
    thereby forming a capacitor in which one plate is contacted by the first and second regions and a second plate is formed by the conductive layer.
6. A semiconductor device as set forth in claim 4 or claim 5 wherein the well and the first region are of N-type material and the second region is of P-type material.
7. A semiconductor device as set forth in claim 4 or claim 5 wherein the well and the first region are of P-type material and the second region is of N-type material.

* * * * *